(12) United States Patent
Hou et al.

(10) Patent No.: US 7,631,426 B2
(45) Date of Patent: Dec. 15, 2009

(54) METHOD OF MANUFACTURING A HEAT PIPE

(75) Inventors: Chuen-Shu Hou, Tu Cheng (TW);
 Chao-Nien Tung, Tu Cheng (TW);
 Tay-Jian Liu, Tu Cheng (TW);
 Cheng-Chi Lee, Tu Cheng (TW)

(73) Assignee: Foxconn Technology Co., Ltd., Tu-Cheng, Taipei Hsien (TW)

( * ) Notice: Subject to any disclaimer, the term of this patent is extended or adjusted under 35 U.S.C. 154(b) by 239 days.

(21) Appl. No.: 11/308,864

(22) Filed: May 16, 2006

(65) Prior Publication Data
 US 2007/0079508 A1    Apr. 12, 2007

(30) Foreign Application Priority Data
 Oct. 11, 2005   (CN)   ................... 2005 1 0100375

(51) Int. Cl.
 *B21D 53/06* (2006.01)
 *B23P 17/00* (2006.01)
(52) U.S. Cl. .................. 29/890.032; 29/890.036; 29/890.053; 29/458; 29/821; 419/5
(58) Field of Classification Search ......... 29/890.032, 29/897.2, 821, 46, 890.036, 890.053, 458, 29/527.2; 419/1, 5, 8; 165/104.26
 See application file for complete search history.

(56) References Cited

U.S. PATENT DOCUMENTS

| | | | | |
|---|---|---|---|---|
| 3,898,850 A | * | 8/1975 | Wyant | ................... 405/234 |
| 3,898,851 A | * | 8/1975 | Wyant | ................... 405/233 |
| 4,066,115 A | * | 1/1978 | Ohtani et al. | ................... 164/9 |
| 4,102,649 A | * | 7/1978 | Sasaki | ................... 366/114 |
| 4,128,074 A | * | 12/1978 | Rejsa | ................... 118/24 |
| 4,196,504 A | * | 4/1980 | Eastman | ................ 29/890.032 |
| 4,562,885 A | * | 1/1986 | Pausch | ................... 165/84 |
| 5,076,352 A | * | 12/1991 | Rosenfeld et al. | ....... 165/104.26 |
| 5,611,230 A | * | 3/1997 | Chelluri et al. | ................ 72/56 |
| 5,743,014 A | * | 4/1998 | Giammaruti et al. | ... 29/890.032 |
| 5,873,408 A | * | 2/1999 | Bellet et al. | ................... 165/84 |
| 6,029,742 A | * | 2/2000 | Burward-Hoy | ............ 165/80.4 |
| 6,230,407 B1 | * | 5/2001 | Akutsu | ................ 29/890.032 |
| 6,273,963 B1 | * | 8/2001 | Barber | ................... 148/108 |
| 6,508,302 B2 | * | 1/2003 | Ishida et al. | ........... 165/104.26 |
| 6,811,745 B2 | * | 11/2004 | Forsberg et al. | ............... 419/10 |
| 6,843,307 B2 | * | 1/2005 | Yuyama et al. | ......... 165/104.26 |
| 6,880,647 B2 | * | 4/2005 | Villareal | ................... 175/40 |
| 6,916,731 B2 | * | 7/2005 | Shimokawa et al. | ........ 438/612 |
| 6,942,018 B2 | * | 9/2005 | Goodson et al. | ........... 165/80.4 |
| 6,991,024 B2 | * | 1/2006 | Goodson et al. | ........... 165/80.4 |
| 7,100,678 B2 | * | 9/2006 | Chien | .................... 165/104.22 |
| 7,120,026 B2 | * | 10/2006 | Chen | ........................... 361/704 |
| 7,251,889 B2 | * | 8/2007 | Kroliczek et al. | ........ 29/890.07 |
| 7,264,039 B2 | * | 9/2007 | Dawson | ...................... 165/84 |

* cited by examiner

*Primary Examiner*—Jermie E Cozart
(74) *Attorney, Agent, or Firm*—Frank R. Niranjan

(57) ABSTRACT

A powder feeding apparatus of manufacturing a heat pipe includes a vibration tray having a supporting board and a plurality of pipes positioned in the supporting board of the tray. A mandrel is coaxially inserted in each of the pipes. A feeder is located corresponding to an end of each pipe for feeding powder into the pipe. A vibration source drive the tray to vibrate along a direction perpendicular to an axial direction of each of the pipes when feeding the powder into the pipes from the feeders, whereby the pipes vibrate with substantially the same amplitude in the vibration direction.

7 Claims, 3 Drawing Sheets

METHOD OF MANUFACTURING A HEAT PIPE

FIELD OF THE INVENTION

The present invention relates generally to an apparatus and a method of manufacturing a heat pipe, and more particularly to an apparatus and a method of manufacturing a heat pipe having a sintered wick structure.

DESCRIPTION OF RELATED ART

Heat pipes have excellent heat transfer performance due to their low thermal resistance, and therefore are an effective means for transferring or dissipating heat from heat sources. Currently, the heat pipes are widely used for removing heat from heat-generating components such as central processing units (CPUs) of computers. A heat pipe is generally a vacuum-sealed pipe. A wick structure is provided on an inner wall of the pipe, and at least a phase changeable working media employed to carry heat is filled in the pipe. Generally, according to positions from which heat is input or output, the heat pipe is defined with three sections, which are evaporating section, condensing section and adiabatic section between the evaporating section and the condensing section.

In use, the heat pipe transfers heat from one place to another place mainly by virtue of phase change of the working media taking place therein. Generally, the working media is liquid such as alcohol, water and so on. When the working media in the evaporating section of the heat pipe is heated up, it vapors, and pressure difference is thus produced between the evaporating section and the condensing section in the heat pipe. Resultant vapor with high enthalpy rushes to the condensing section and condenses there. Then the condensed liquid reflows to the evaporating section along the wick structure. This evaporating/condensing cycle repeats in the heat pipe; consequently, heat is transferred from the evaporating section to the condensing section continually. Due to the continual phase change of the working media, the evaporating section is kept at or near the same temperature as the condensing section of the heat pipe. The heat pipe is used widely owing to its great heat-transfer capability.

The wick structure currently available for heat pipes includes fine grooves integrally formed at the inner wall of the pipe, screen mesh or bundles of fiber inserted into the pipe and held against the inner wall thereof, or sintered powder combined to the inner wall of the pipe by sintering process. Among these wicks, the sintered wick is preferred to the other wicks with respect to heat transfer ability and ability against gravity.

It is known that porosity and void size of the sintered wick structure are important parameters for the heat transfer capacity of the heat pipe. Packing density of the powder before being sintered is an important factor to affect the porosity, void size, wick strength, sintering temperature, seepage force and capillary force of the wick structure of the heat pipe.

Originally, the pipes have powder fed thereinto mainly by manual force, which results in low manufacturing yield and uneven packing density of the powder in the pipes. In order to overcome the disadvantage of manual process, automatization system is used to feed powder into the pipes. Referring to FIG. 3, a conventional powder feeding apparatus for manufacturing a heat pipe is illustrated. In the apparatus, a vibratory tray 4 is used. The tray 4 mechanically connects with a vibratory source 6 located asides the tray 4. The tray 4 comprises opposite upper and low supporting boards 41, 42 at top and bottom thereof, and a pair of sidewalls 43 connecting with corresponding ends of the upper and lower supporting boards 41, 42. The upper and low supporting boards 41, 42 define a plurality of corresponding through holes (not labeled) therein. A plurality of pipes 3 is positioned in the through holes of the upper and lower supporting boards 41, 42. A mandrel 2 is inserted in each pipe 3. Sintering powder 5 is fed to funnels 1 disposed at upper ends of the pipes 3. The vibratory source 6 works and drives the tray 4 to vibrate up and down, as indicated by arrows C, D shown in FIG. 3, i.e., vibrating along an axial direction of the pipes 3, to thereby deposit the powder 5 into the pipes 3 at a certain speed from the funnels 1. However, the vibratory source 6 drives the tray 4 to vibrate in vertical direction, which arises a problem that the tray 4 has different amplitudes of vibration. The pipes adjacent to the vibratory source 6 have smaller amplitudes and have smaller amount of powder 5 deposited in the pipes 3, while the pipes 3 remote from the vibratory source 6 have larger amplitudes and have larger amount of powder 5 deposited in the pipes 3. As a result, in the same lot, the pipes 3 have different amount of powder fed therein and have different wick structures after the powder 5 is sintered. This causes the heat pipes made therefrom to have an uneven quality.

Therefore, it is desirable to provide a powder feeding apparatus and method of manufacturing a heat pipe which can over the shortcomings of the conventional art.

SUMMARY OF THE INVENTION

A powder feeding apparatus of manufacturing a heat pipe in accordance with a preferred embodiment of the present invention comprises a vibration tray having a supporting board and a plurality of pipes positioned in the supporting board of the tray. A vibration source is located aside the vibration tray for driving the vibration tray to vibrate. A mandrel is coaxially inserted in each of the pipes. A feeder is located corresponding to an end of each pipe for feeding powder into the pipe. The vibration source drives the tray to vibrate in a horizontal direction perpendicular to axes of the pipes when feeding the powder into the pipes from the feeders, whereby the pipes vibrate with substantially the same amplitude in the vibration direction.

The present invention in another aspect, relates to a method of manufacturing a heat pipe, comprising steps: 1) proving a vibration tray connecting with a vibration source located aside the vibration tray; 2) positioning a plurality of pipes in the vibration tray; 3) inserting a mandrel into each of the pipes; 4) positioning a feeder corresponding to each of the pipes; 5) starting the vibration source to drive the vibration tray to vibrate in a horizontal direction perpendicular to axes of the pipes, and feeding powder into the pipes from the feeders; 6) sintering the powder in the pipes; 7) extracting the mandrels from the pipes, filling working media into the pipes, vacuuming and sealing the pipes.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
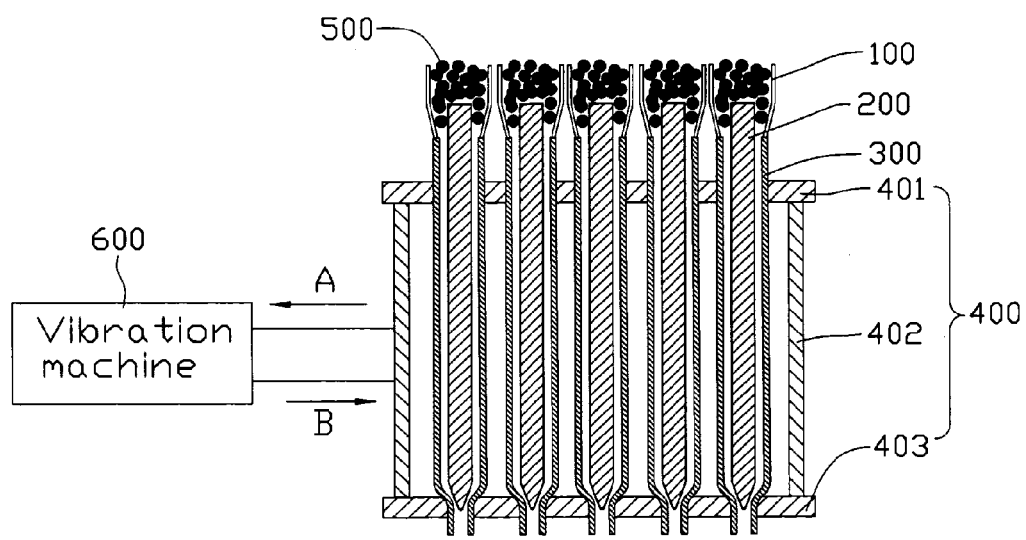
FIG. 1 is a longitudinal cross-sectional view of a powder feeding apparatus in accordance with a first embodiment of the present invention.

FIG. 1 illustrates a powder feeding apparatus of manufacturing a heat pipe in accordance with a preferred embodiment of the present invention. The powder feeding apparatus comprises a vibratory tray 400. The tray 400 mechanically connects with a vibratory source 600 such as a vibratory machine located aside the tray 400, for providing vibration to the tray 400 when feeding powder 500 into a plurality of pipes 300 positioned in the tray 400. The tray 400 comprises opposite upper and lower supporting boards 401, 403 at top and bottom thereof, and a pair of spaced sidewalls 402 connecting with corresponding ends of the upper and lower supporting boards 401, 403. The upper and low supporting boards 401, 403 define a plurality of corresponding through holes (not labeled) therein, wherein a diameter of each of the holes of the upper supporting board 401 is larger than that of each of the holes of the lower supporting board 403. The pipes 300, each having a cylindrical body (not labeled) and a lower end (not labeled) tapered from the body, are positioned in corresponding holes of upper and lower supporting boards 401, 403. An outer diameter of the body of each pipe 300 is smaller than that of a corresponding hole of the upper supporting board 401, but larger than that of a corresponding hole of the lower supporting board 403. A diameter of the lower end of each pipe 300 is smaller than that of a corresponding hole of the lower supporting board 403. The lower end of each pipe 300 is accommodated in the corresponding hole of the lower supporting board 403. An upper end of each pipe 300 is accommodated in the corresponding hole of the upper supporting board 401. A mandrel 200 is coaxially inserted in a center of each pipe 300. A feeding funnel 100 is disposed at a corresponding upper end of each pipe 300, for feeding the powder 500 to the pipe 300. In use, the vibratory source 600 drives the tray 400 to vibrate in a direction perpendicular to the axes of the pipes 300, as indicated by arrows A, B shown in FIG. 1.

Figure 2:
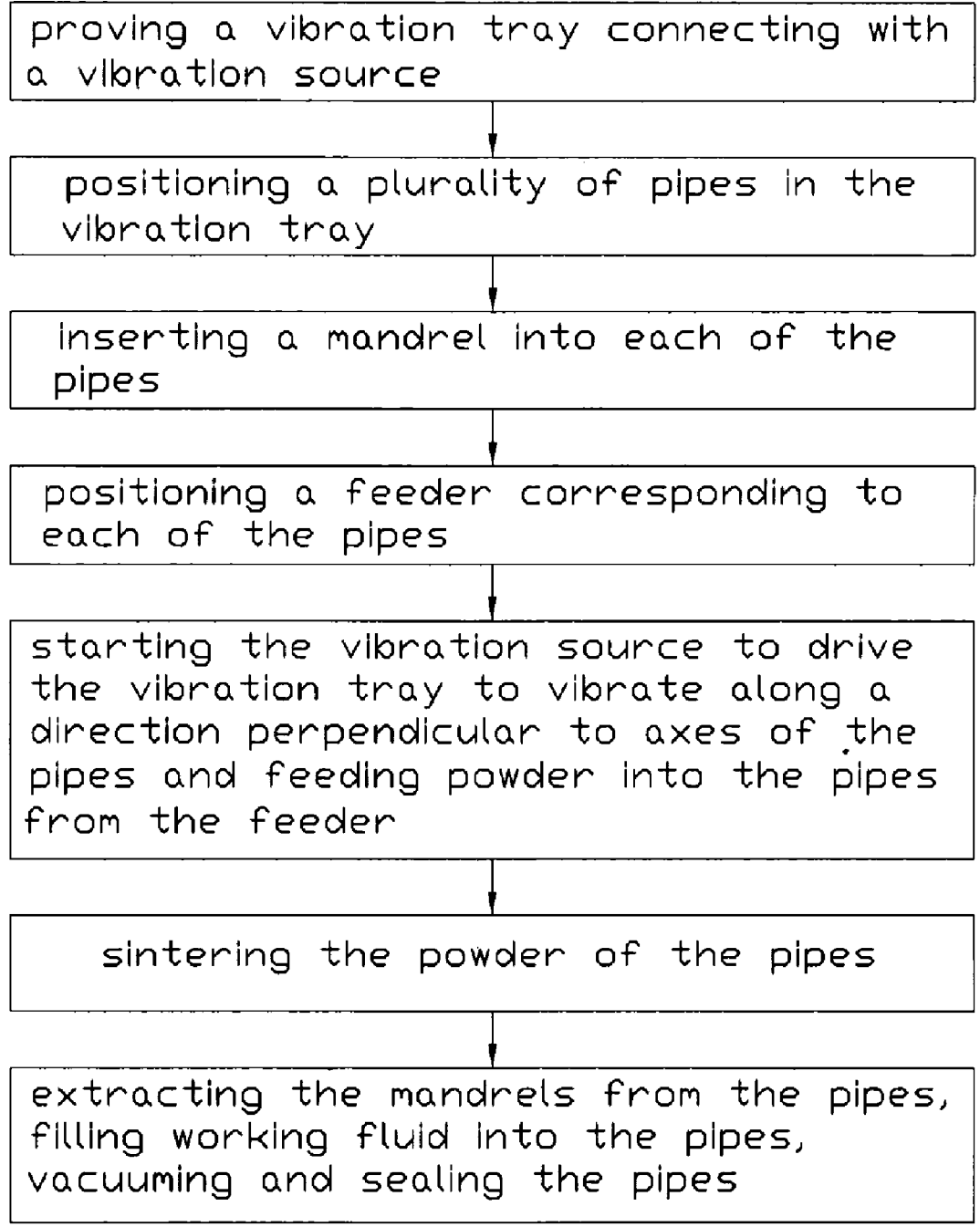
FIG. 2 is a flow chart of manufacturing a sintered wick heat pipe in accordance with a preferred embodiment of the present invention.
Figure 3:
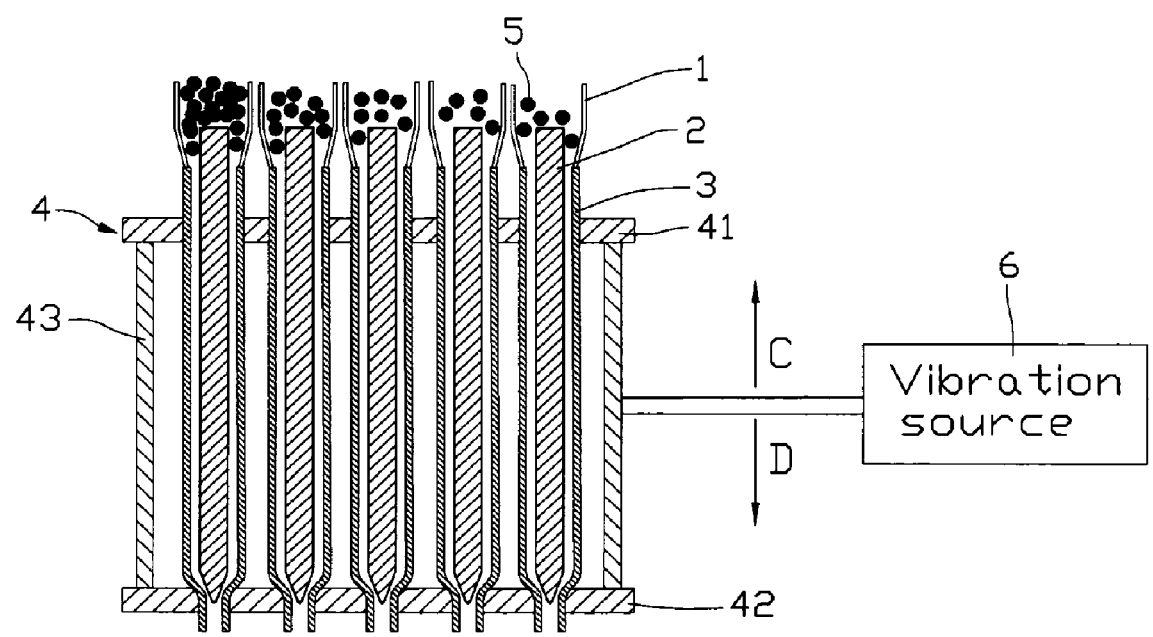
FIG. 3 is a longitudinal cross-sectional view of a powder feeding apparatus in accordance with the conventional art.

Referring to FIG. 2, in accordance with a preferred embodiment of the present invention, a powder feeding method of manufacturing a heat pipe in use of the powder feeding apparatus illustrated above comprises steps: 1) positioning the plurality of pipes 300 in the tray 400; 2) coaxially inserting the mandrel 200 into each pipe 300; 3) positioning the feeding funnel 100 to the upper end of each pipe 300; 4) filling the powder 500 such as copper or aluminum powder into the funnel 100; 5) starting the vibratory source 600 to drive the tray 400 to vibrate in a horizontal plane, i.e., vibrating along a direction perpendicular to the axes of the pipes 300. By this, the powder 500 is fed into a space between the mandrel 200 and the pipe 300.

According to the powder feeding apparatus and method of manufacturing a heat pipe, the vibratory source 600 is located asides the tray 400 and drives the tray 400 to vibrate in a direction perpendicular to the axes of the pipes 300, thereby driving the pipes 300 in the tray 400 to vibrate with substantially the same amplitude in the horizontal plane. Consequently, the pipes 300 in a same lot have substantially the same amount of powder filled therein.

After feeding the powder 500 into the pipes 300, the pipes 300 are then subjected to following steps to become heat pipes: 1) sintering the powder 500 in the pipe 300 to a form wick structure attached to an inner wall of the pipes 300; 2) extracting the mandrels 200 out of the pipes 300, filling working media (liquid) into the pipes 300, vacuuming the pipes 300 and sealing the pipes 300. By these steps, the heat pipes with the sintered wick structures are produced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method of manufacturing a heat pipe, comprising steps:

provides a vibration tray connecting with a vibration source located aside the vibration tray;

positioning a plurality of pipes in the vibration tray;

inserting a mandrel into each of the pipes;

positioning a feeder corresponding to each of the pipes;

starting the vibration source to drive the vibration tray to vibrate in a horizontal direction perpendicular to axes of the pipes and feeding powder into the pipes from the feeders;

sintering the powder of the pipes;

extracting the mandrels from the pipes, filling working media into the pipes, vacuuming and sealing the pipes;

wherein the vibration tray comprises upper and lower supporting boards, the pipes being positioned in the supporting boards;

wherein the upper and lower supporting boards of the vibration tray define a plurality of through holes therein, the heat pipes being positioned in corresponding holes;

wherein a diameter of each of the holes of the upper supporting board is larger than that of each of the holes of the lower supporting board of the vibration tray; and wherein the pipes each comprise a body having a diameter smaller than that of each of the holes of the upper supporting board but larger than that of each of the holes of the lower supporting board of the vibration tray, and a lower end tapered from the body having a diameter smaller than that of each of the holes of the lower supporting board of the vibration tray.

2. The method of manufacturing a heat pipe of claim 1, wherein the vibration source is a vibration machine located aside the vibration tray.

3. The method of manufacturing a heat pipe of claim 1, wherein the vibration tray comprises two sidewalls connecting corresponding ends of the upper and lower supporting boards thereof.

4. The method of manufacturing a heat pipe of claim 1, wherein the pipes each have the body accommodated in a corresponding hole of the upper supporting board, and the lower end thereof accommodated in a corresponding hole of the lower supporting board.

5. The method of manufacturing a heat pipe of claim 1, wherein the feeder is a feeding funnel positioned at an end of each of the pipes.

6. A method of manufacturing a heat pipe, comprising steps:

providing a vibration tray connecting with a vibration source located aside the vibration tray;

positioning a plurality of pipes in the vibration tray;
inserting a mandrel into each of the pipes;
positioning a feeder corresponding to each of the pipes;
starting the vibration source to drive the vibration tray to vibrate and feeding powder into the pipes from the feeders;
sintering the powder of the pipes;
extracting the mandrels from the pipes, filling working media into the pipes, vacuuming and sealing the pipes;
wherein the vibration tray comprises upper and lower supporting boards, the upper and lower supporting boards define a plurality of through holes therein, and the heat pipes are positioned in corresponding holes;
wherein the pipes each comprise a body having a diameter smaller than that of each of the holes of the upper supporting board but larger than that of each of the holes of the lower supporting board of the vibration tray, and a lower end tapered from the body having a diameter smaller than that of each of the holes of the lower supporting board of the vibration tray; and
wherein the vibration source drives the vibration tray to vibrate in a horizontal direction perpendicular to axes of the pipes when the powder is fed into the pipes from the feeders.

7. The method of manufacturing a heat pipe of claim 6, wherein a diameter of each of the holes of the upper supporting board is larger than that of each of the holes of the lower supporting board of the vibration tray.

* * * * *

UNITED STATES PATENT AND TRADEMARK OFFICE
CERTIFICATE OF CORRECTION

PATENT NO.      : 7,631,426 B2                                    Page 1 of 1
APPLICATION NO. : 11/308864
DATED           : December 15, 2009
INVENTOR(S)     : Hou et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 452 days.

Signed and Sealed this

Second Day of November, 2010

David J. Kappos
*Director of the United States Patent and Trademark Office*